United States Patent [19]
Johnson

[11] Patent Number: 4,968,355
[45] Date of Patent: Nov. 6, 1990

[54] TWO-AXIS TRACKING SOLAR COLLECTOR MECHANISM

[76] Inventor: Kenneth C. Johnson, 201 W. California Ave., #401, Sunnyvale, Calif. 94086

[21] Appl. No.: 338,593

[22] Filed: Apr. 14, 1989

[51] Int. Cl.$^5$ .................... H02N 6/00; F24J 2/00
[52] U.S. Cl. .................... 136/246; 126/424; 350/258
[58] Field of Search ............ 136/246, 248; 126/424, 126/425; 353/3; 350/258; 250/203 R

[56] References Cited
U.S. PATENT DOCUMENTS

| | | | |
|---|---|---|---|
| 4,088,121 | 5/1978 | Ladeyre | 126/424 |
| 4,210,121 | 7/1980 | Stark | 126/424 |
| 4,316,448 | 2/1982 | Dodge | 126/424 |
| 4,361,758 | 11/1982 | Rotolo | 250/203 R |
| 4,386,600 | 6/1983 | Eggert, Jr. | 126/438 |
| 4,429,178 | 1/1984 | Prideaux et al. | 136/246 |
| 4,691,075 | 9/1987 | Murphy | 136/246 |
| 4,771,764 | 9/1988 | Cluff | 126/440 |
| 4,870,949 | 10/1989 | Butler | 126/424 |

OTHER PUBLICATIONS

"Down the Tubes: Solar Light Goes Indoors"; Stephen P. Schuber; *Architectural Lighting*; Feb. 1987, pp. 32–35.
"Catching Some Rays: New Device Delivers Filtered Sunlight Indoors"; Stephen Mallery, *Architectural Lighting*, Oct. 1987, pp. 27–30.
"Photovoltaic Concentrator Array Evaluation"; A. B. Maish, *INTERSOL* 85, pp. 1649–1653.

Primary Examiner—Aaron Weisstuch
Attorney, Agent, or Firm—Townsend and Townsend

[57] ABSTRACT

This invention is a novel solar tracking mechanism incorporating a number of practical features that give it superior environmental resilience and exceptional tracking accuracy. The mechanism comprises a lightweight space-frame assembly supporting an array of point-focus Fresnel lenses in a two-axis tracking structure. The system is enclosed under a glass cover which isolates it from environmental exposure and enhances tracking accuracy by eliminating wind loading. Tracking accuracy is also enhanced by the system's broad-based tracking support. The system's primary intended application would be to focus highly concentrated sunlight into optical fibers for transmission to core building illumination zones, and the system may also have potential for photovoltaic or photothermal solar energy conversion.

13 Claims, 6 Drawing Sheets

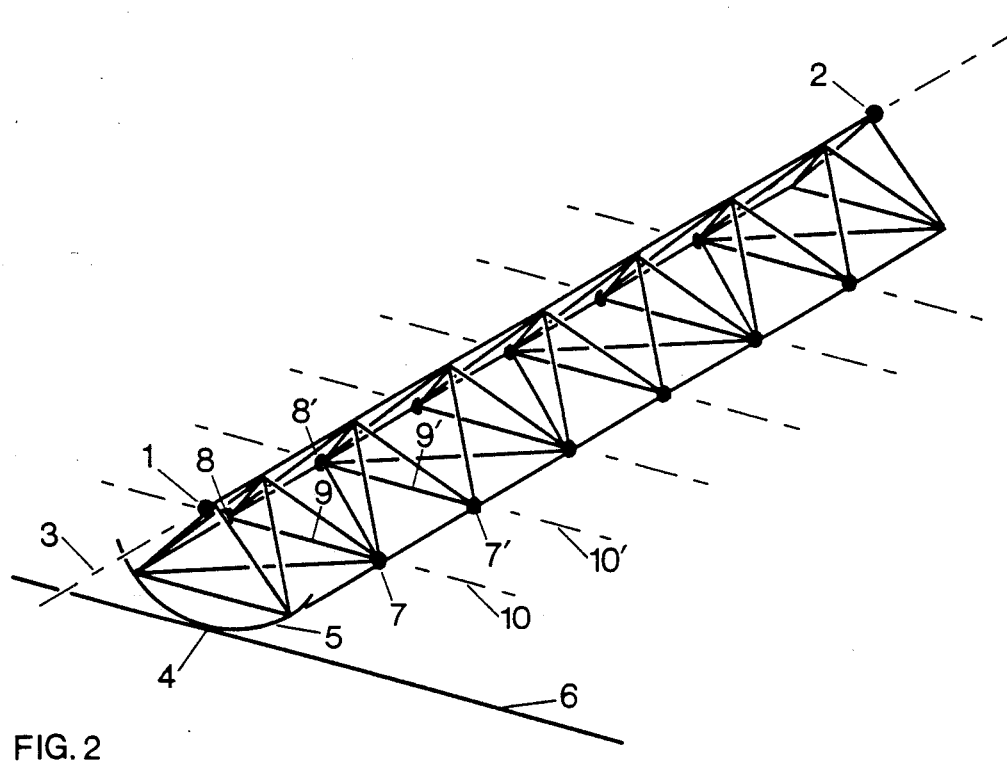
FIG. 2
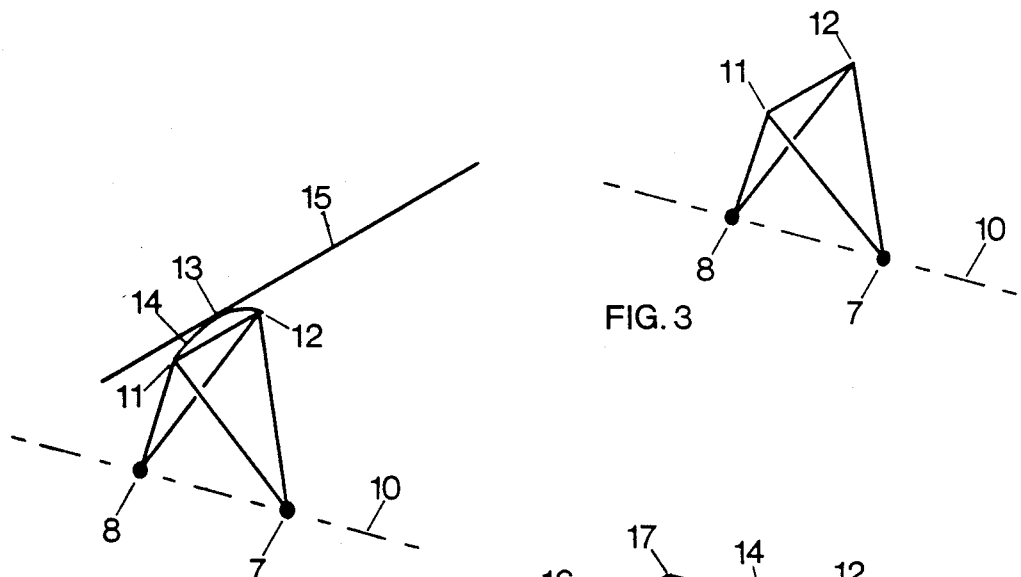
FIG. 4
FIG. 3
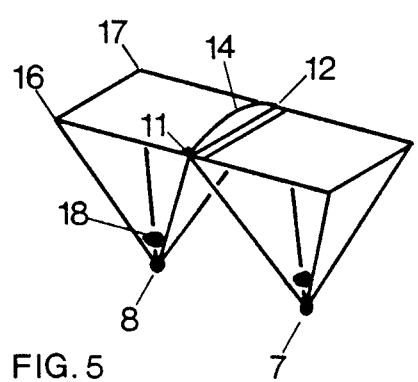
FIG. 5

TWO-AXIS TRACKING SOLAR COLLECTOR MECHANISM

ACKNOWLEDGEMENT

This invention was made with Government support under contract DE-AC03-76SF00098 awarded by the Department of Energy. The Government has certain rights in this invention.

LITERATURE REFERENCES

[1] "Down the tubes: Solar light goes indoors", Stephen P. Schuber, *Architectural Lighting*, Feb. 1987, pp. 32–35.

[2] "Catching some rays: New device delivers filtered sunlight indoors", Stephen Mallery, *Architectural Lighting*, Oct. 1987, pp. 27–30.

[3] "Photovoltaic concentrator array evaluation", A. B. Maish, *INTERSOL* 85, pp. 1649–1653.

BACKGROUND OF THE INVENTION

1. Field of the Invention

This invention relates generally to the tracking, collection and concentration of sunlight for the purpose of solar energy utilization. Specifically, the invention pertains to mechanical means for effecting two-axis tracking of an array of point-focus Fresnel lens concentrators. In its primary intended application, the mechanism would function as a component of a core daylighting system (which supplies daylight to core building spaces) wherein each lens would focus sunlight into a fiber optic element. The invention may also find use for concentrator photovoltaic systems, and it could possibly have potential for photothermal energy conversion as well.

2. Description of the Prior Art

A wide variety of two-axis tracking mechanisms are known in the prior art. Core daylighting systems use mechanisms such as the pedestal-mounted heliostat mirror in TIR Systems' collector [Ref. 1] and the fork-mounted Fresnel lens array in the Himawari system [Ref. 2]. Examples of photovoltaic trackers include the pedestal-mounted torque tube configuration of the intersol array and the end-post tilt/roll system used by ENTECH [Ref. 3].

The optical concentration attained by a concentrating collector is fundamentally limited by the system's optical aberrations and mechanical tracking errors. Photovoltaic systems achieve concentration levels of up to around 1000×, but a core daylighting system employing fiber optics may need to achieve geometric concentrations of up to nearly 10,000× in order to minimize the quantity and cost of optical fiber material required. This level of concentration could not likely be achieved with photovoltaic-type systems, largely due to the effect of wind loading which induces large tracking errors.

Core daylighting systems avoid wind loading effects by housing the tracking system under a transparent protective cover such as the Himawari's acrylic globe or TIR Systems' solarium enclosure. The Himawari's enclosure is exceedingly expensive due to the high cost of the acrylic material, and its curved shape introduces optical aberrations, but these disadvantages are avoided with an enclosure system such as TIR Systems' which uses conventional low-cost, flat window glazing material in its construction.

In addition to eliminating wind-induced tracking errors, a collector enclosure isolates the tracking system from severe storm conditions and prevents degradation from long-term environmental exposure. Despite these advantages, it is not practical to enclose conventional photovoltaic collector systems due to their large dimensional scale. Thus, an essential practical feature of a system such as TIR Systems' collector is its relatively small scale.

One disadvantage of TIR Systems' collector is that it requires two reflective optical elements, one for tracking and one for concentrating. Moreover, in comparison to Fresnel lenses a reflective element's optical performance is very sensitive to surface warpage and tilt errors, making it difficult to achieve high optical concentration. Generally, Fresnel lenses are preferred over mirrors for photovoltaic systems and for core daylighting systems such as the Himawari which use fiber optics.

A common shortcoming of all of the tracking systems discussed above is the intrinsic mechanical instability of their tracking drives. A tracking element's rotational position about its tracking axis is constrained by a drive coupling (e.g. a gear mesh) which is conventionally located very close to the tracking axis, making the system very sensitive to torque loading about the axis. A mechanism such as TIR Systems' heliostat tracker which has very short tracking axles is also susceptible to torque loading about axes transverse to the tracking axis. Moreover, these types of tracking systems are also very sensitive to positional errors in the drive coupling (e.g. backlash), making it difficult to achieve stringent tracking tolerances even in the absence of torque loading.

SUMMARY OF THE INVENTION

An analysis of the strengths and weaknesses of prior art tracking collectors reveals several fundamental design principles which can be applied to obtain an improved collector design. The first of these principles relates to a collector's optimal dimensional scale.

For a structure that is designed primarily to resist wind loads, such as an environmentally exposed collector or a collector enclosure, the amount of structural material required per unit of collected solar energy is generally proportional to the system's linear dimensional scale. For example, if a system's linear dimensions are all doubled, its angular deflections under wind loading and its maximum sustainable wind speed will remain unchanged (since wind-induced forces are proportional to the system's area dimensions); but whereas the volume of structural material will increase by a factor of eight, the system's aperture area and the collected solar flux will increase by only a factor of four. Hence, a small dimensional scale would be favored to minimize a wind-loaded structure's weight and material requirements.

For a structure such as an enclosed tracking system that is designed primarily to support its own weight, the system's angular deflections and resultant tracking error under weight loading would be proportional to its linear dimensional scale; hence a small dimensional scale would also be favored to minimize tracking errors due to weight loading.

A small-scale tracking structure can be housed under a protective glass enclosure which does not require excessively thick glass or complex mounting structures. Although the enclosure would contribute to the system cost and would result in about 10% optical reflectance loss, these drawbacks would be far outweighed by several cost and performance advantages in the tracking structure: The elimination of wind loading would improve tracking accuracy; isolation of the system from environmental influences such as dust, rain, hail, ultraviolet exposure, bird droppings, etc. would obviate the need for environmentally resilient structural and optical materials, would make maintenance easier, and would improve system lifetime and reliability; and since the tracking structure would not need to sustain storm conditions with 50- to 100-mile-per-hour winds, its weight and material requirements could be reduced by perhaps an order of magnitude relative to an unenclosed system.

In principle, there is no lower limit on the amount of structural material that would be required for an enclosed tracking system comprising intrinsically rigid structural elements such as dome-shaped Fresnel lenses and axially-loaded struts assembled in a space-frame structure. (The rigidity condition excludes nonrigid structures such as flat lenses or cantilevered support beams.) In the absence of wind loading the structure's own weight would be the only significant source of structural loading. If the system design is modified to use less structural material, for example by decreasing the lens thickness and the struts' sectional areas all by a common scaling factor, the system's reduced weight load would exactly offset its reduced structural rigidity and its weight-induced strain would be unchanged. Hence, an enclosed tracking system could comprise a very lightweight assembly of thin-shell Fresnel lenses supported by structural elements such as thin-walled struts in a space-frame configuration.

A collector's tracking accuracy depends on its structural rigidity and also on the mechanical stability of its axial bearings and tracking drive. Mechanical stability can be optimized by supporting each tracking element at two widely-separated bearing points and by locating the drive coupling as far from the tracking axis as is practical. The advantage of this type of broad-based support configuration can be illustrated by considering a conventional-type tracking element comprising a collector aperture of radius 1 meter which is coupled to the tracking drive via an attached gear of radius 10 cm at the center of the aperture. If the rim of the aperture is to be positioned within a 1-mm tolerance range, the positioning tolerance at the gear coupling would be 0.1 mm; and a 1-lb force on the aperture rim would induce a 10-lb force on the drive coupling. If the drive coupling could be located 1 meter from the tracking axis, however, both the positioning tolerance and the torque-induced stress at the drive coupling would be relaxed by a factor of ten. This illustrates how order-of-magnitude improvements in tracking accuracy can be obtained by using a broad-based tracking support.

My invention is a novel tracking system that implements the design principles outlined above. The system comprises a glass enclosure housing a comparatively small-scale, lightweight space-frame assembly of axially-loaded struts supporting a collection of dome-shaped, point-focus Fresnel lenses in a two-axis tracking structure. In contrast to conventional photovoltaic-type tracking collectors which must support most of the collector weight on tracking bearings, the bulk of the system's weight would be in the stationary enclosure structure. The system has a very broad-based tracking support which gives it exceptional tracking resolution. This feature, in addition to the space frame's intrinsic rigidity and its isolation from wind loading, could make possible order-of-magnitude improvements in tracking accuracy relative to prior art tracking systems.

BRIEF DESCRIPTION OF THE DRAWINGS

FIG. 2 illustrates a tracking module's truss structure.

FIG. 3 illustrates a concentrator unit's structural framework.

FIG. 4 illustrates a concentrator unit's tracking wheel segment which is coupled to the tracking module's declination drive element.

FIG. 5 illustrates a concentrator unit with its two attached Fresnel lenses and receivers.

DESCRIPTION OF THE ILLUSTRATED EMBODIMENT

The tracking mechanism comprises the following basic elements:

1. a stationary base structure which supports the tracking components,
2. one or more pairs of coaligned axial polar bearings attached to the base structure,
3. one or more tracking modules, each supported between two coaligned polar bearings and comprising:
   3.1 a polar-tracking truss structure which is supported at its ends by the two bearings,
   3.2 a large-radius polar wheel segment (e.g. a gear or pulley segment) attached to the truss, wherein the polar tracking motion is transmitted through a polar drive coupling (e.g. a gear mesh) on the wheel's circumference,
   3.3 several pairs of coaligned axial declination bearings attached to the truss,
   3.4 several declination-tracking concentrator units, each supported by two coaligned declination bearings and comprising:
      3.4.1 a tetrahedral structural frame straddling the truss and supported at two lower corners by the two declination bearings,
      3.4.2 a large-radius declination wheel segment extending across the tetrahedron's two upper corners, wherein the declination tracking motion is transmitted through a declination drive coupling on the wheel's circumference, 3.4.3 two Fresnel lens and receiver assemblies mounted on either side of the tetrahedral frame, 3.5 a declination drive element (e.g. a shaft, belt or cable) which extends across the concentrator units' wheel segments and which simultaneously transmits the declination tracking motion to all of the units on the truss, 4. a polar drive mechanism linking each polar wheel segment to a polar tracking actuator, 5. a declination drive mechanism linking each module's declination drive element to a declination tracking actuator.

The actuators would typically be digitally-controlled stepping motors. An entire collector array comprising a collection of tracking modules supported on a common base structure may be mechanically controlled by a single pair of stepping motors, and an entire collector field comprising a collection of independent arrays may be electronically controlled by a single dual-channel digital controller.

Figure 1:
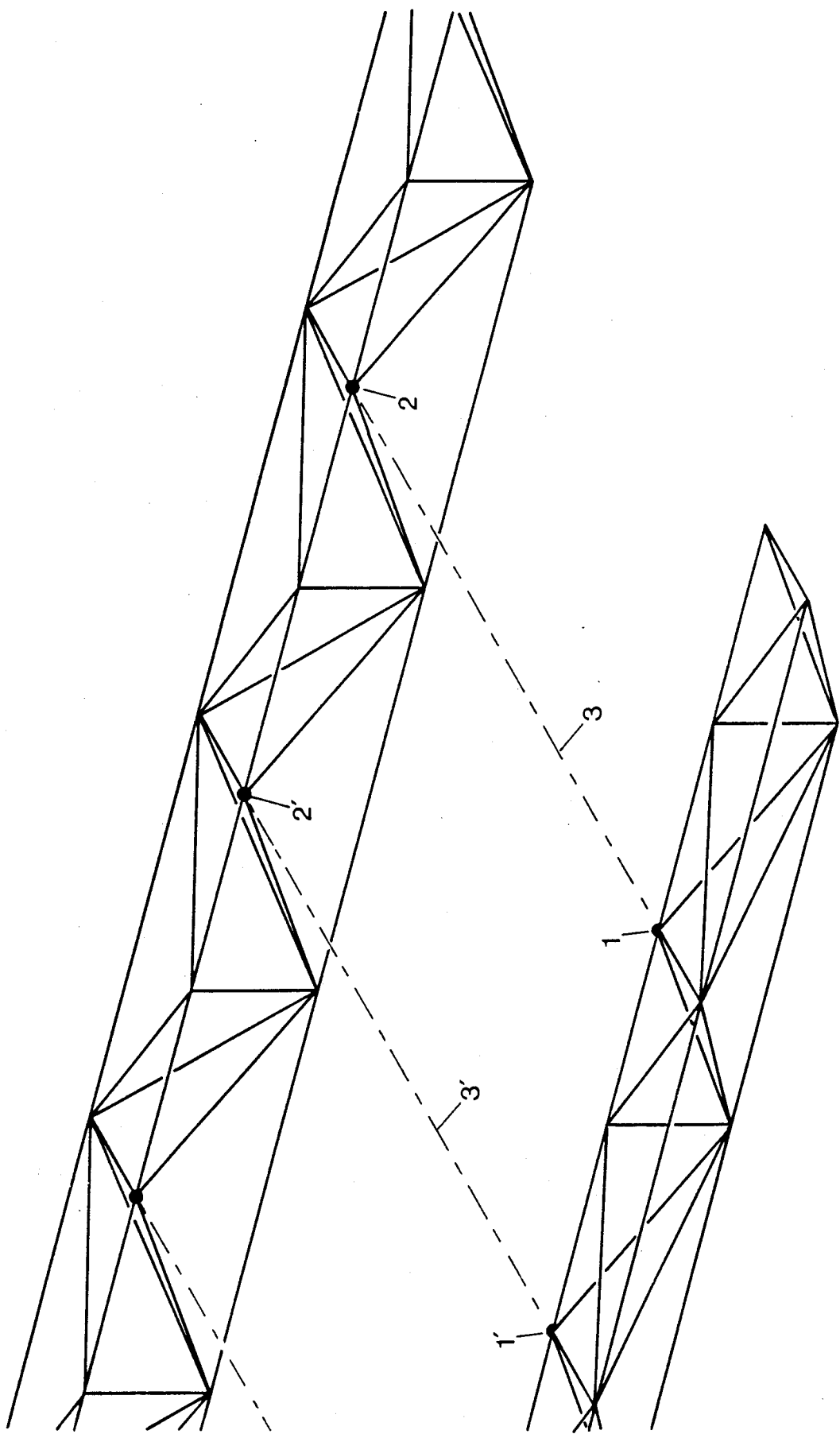
FIG. 1 illustrates a collector system's base structure which comprises two stationary trusses.

The base structure may comprise a pair of parallel trusses as illustrated in FIG. 1. The structure supports two parallel rows of uniformly spaced axial polar bearings (e.g. a row consisting of bearings 1, 1', etc. and a row consisting of bearings 2, 2', etc.). In some embodiments each row may consist of just one bearing. Each bearing of each row is coaligned with an associated bearing of the other row (e.g. 1 with 2 and 1' with 2'). The polar rotation axes defined by the coaligned pairs (e.g. axes 3 and 3') are all mutually parallel and are preferably aligned with the Earth's axis; thus the polar drive effects diurnal tracking.

Each pair of coaligned polar bearings supports a tracking module's structural frame comprising a polar-tracking truss such as the structure illustrated in FIG. 2, which is supported between bearings 1 and 2. The truss structure comprises a rigid space-frame assembly which is positionally constrained by the two axial bearing couplings and by a third mechanical coupling 4 on the circumference of a large-radius wheel segment 5 centered on the polar axis 3. A polar drive actuator (e.g. a stepping motor) attached to the base structure may be directly coupled to the wheel segment (for example by means of a gear, timing belt or cable winding), but the polar tracking motion would preferably be transmitted from a single actuator through a polar drive element 6 (e.g. a shaft, flat belt or cable) which simultaneously drives all of the modules in an array.

Each module's truss structure supports two rows of uniformly spaced axial declination bearings (e.g. a row consisting of bearings 7, 7', etc., and a row consisting of bearings 8, 8', etc.—see FIG. 2). The rows are parallel to the polar axis 3 and are disposed alongside the truss with the truss between them. Distances between adjacent bearings are rigidly constrained by connecting structural elements such as the cross struts 9, 9', etc. Each bearing of each row is coaligned with an associated bearing of the other row (e.g. 7 with 8 and 7' with 8'). The declination rotation axes defined by the coaligned pairs (e.g., axes 10 and 10') are mutually parallel and are preferably aligned perpendicular to the module's polar axis 3; thus the declination drive effects seasonal tracking.

Each pair of coaligned declination bearings supports a concentrator unit's structural frame such as the structure illustrated in FIG. 3, which is supported by bearings 7 and 8. The frame is a tetrahedral space-frame assembly comprising five structural elements connecting two mounting points 11 and 12 to each other and to each of the bearing points 7 and 8. (One of the supporting truss structure's cross struts 9 forms the tetrahedron's sixth edge—see FIG. 2.)

The concentrator unit is positionally constrained by the two axial bearing couplings 7 and 8 and by a third mechanical coupling 13 (FIG. 4) on the circumference of a large-radius wheel segment 14 which is centered on the declination axis 10 and attached to the two mounting points 11 and 12. (The structural element constraining the two mounting points' separation distance may comprise the wheel segment.) Each module's declination tracking motion is transmitted from a single tracking actuator through a declination drive element 15 (e.g. a shaft, flat belt or cable) which simultaneously drives all of the module's concentrator units.

Each of the concentrator unit's two triangular frames defined by one of the two bearings 7 or 8, the mounting points 11 and 12, and the structural linkages between these three elements serves as a mounting base on which a Fresnel concentrator lens and a small energy receiver are attached (FIG. 5). In the illustrated embodiment, each Fresnel lens is mounted in a square frame, with two corners of the frame being located at points 11 and 12 and the other two corners (e.g., points 16 and 17) being attached by lightweight struts to the axial bearing 7 or 8. The lens should have a slightly domed shape to give it good intrinsic mechanical rigidity, and added rigidity may be provided by two reinforcement elements (e.g., ribs, thin struts, or wires) diagonally crossing the lens frame. The lens focuses sunlight onto a small energy receiver 18 located near the axial bearing point 7 or 8.

Figure 6:
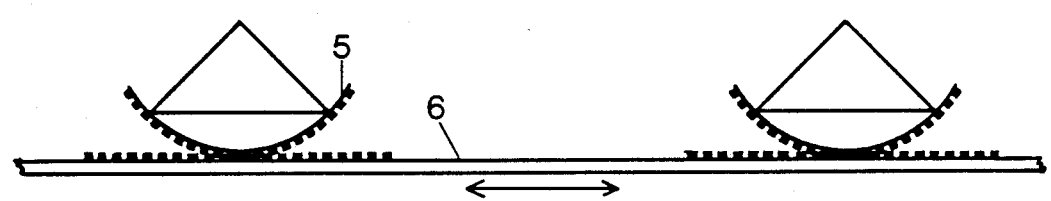
FIG. 6 illustrates a tracking drive element comprising a rack.
Figure 7:
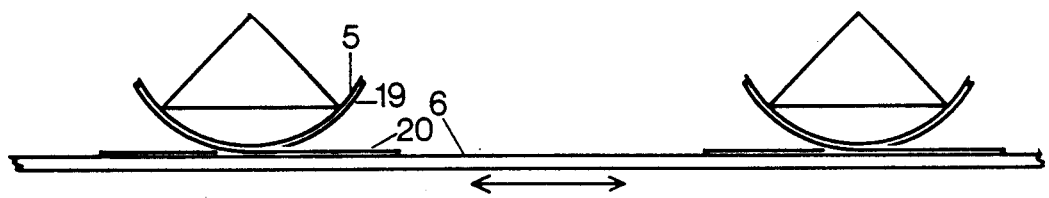
FIG. 7 illustrates a tracking drive element comprising a translational shaft or belt with a double-pull belt or cable coupling.
Figure 8:
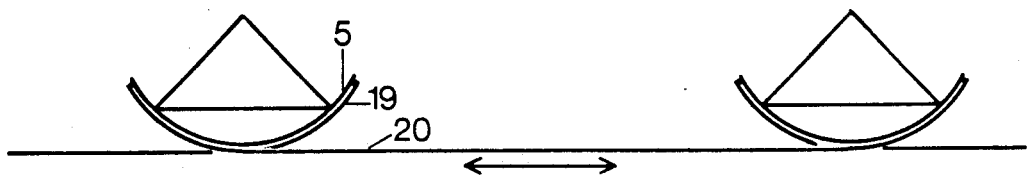
FIG. 8 illustrates a variant of the double-pull translational tracking drive.

The polar drive element 6 (FIG. 2) and declination drive element 15 (FIG. 4) may comprise any of a variety of types of drive components which are well known in the mechanical arts. FIGS. 6-10 illustrate several possible configurations for the polar drive, and similar mechanisms may be used for the declination drive. FIG. 6 illustrates a polar drive element 6 comprising a rack which transmits motion to a polar wheel segment 5 comprising a gear segment via axial translation of element 6, wherein 5 and 6 are mechancially coupled through a gear mesh on the wheel's circumference. FIG. 7 illustrates another mechanism that also effects tracking motion via axial translation of the drive element: The drive element 6 is a shaft or flat belt, the wheel segment 5 is a pulley segment, and mechanical coupling between 5 and 6 is effected by means of two flat belts or cables 19 and 20 that are attached to and guided over the pulley segment and are attached to the drive element in a double-pull configuration. Alternatively, elements 19 and 20 may be linked directly to adjacent pulley segments, and element 6 in FIG. 7 may be eliminated, as illustrated in FIG. 8. (In this configuration the drive element would comprise the series of connector cables including elements 19 and 20.) However, the FIG. 8 configuration could exhibit significant cumulative positioning tolerance errors between adjacent pulley segments and would involve complicated system alignment procedures.

Figure 9:
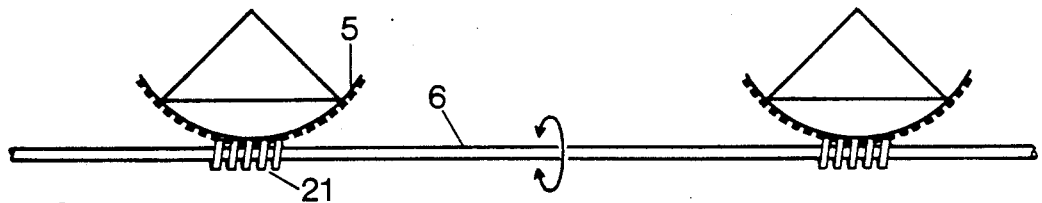
FIG. 9 illustrates a tracking drive element comprising a worm on a rotational drive shaft.
Figure 10:
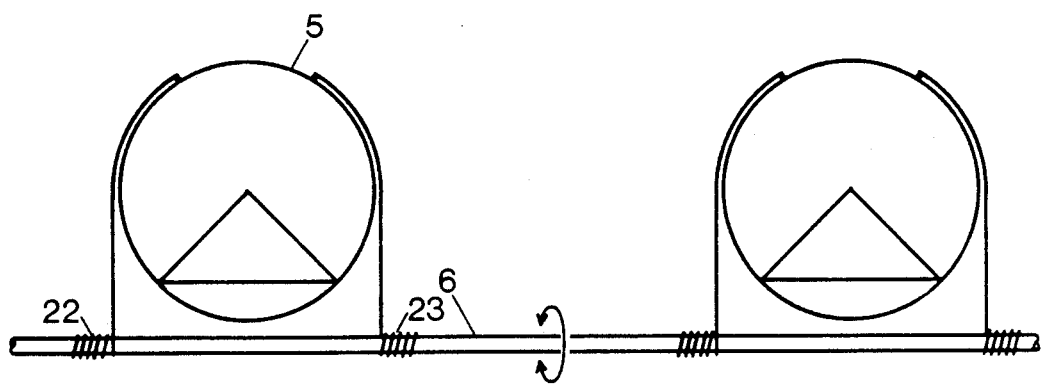
FIG. 10 illustrates a tracking drive element comprising a rotational shaft with two cable-winding couplings.

FIGS. 9 and 10 illustrate two drive mechanisms that effect tracking motion via axial rotation of the drive element. In FIG. 9 the drive element 6 is a rotational shaft, the wheel segment 5 is a worm gear segment, and mechanical coupling between 6 and 5 is effected by means of a worm 21 which engages element 5's gear teeth. (A worm drive would not necessarily need to be oriented with the drive shaft's axis perpendicular to the worm gear's axis.) In FIG. 10 a drive element 6 comprising a rotational shaft is coupled to a wheel 5 comprising a pulley via two cable windings 22 and 23. (The "wheel segment" in the above descriptions may comprise a complete wheel as in FIG. 10.)

Of the various drive mechanisms illustrated in FIGS. 6-10, the worm drive could be expected to exhibit the best tracking resolution due to the high step-down gearing ratio between the worm and worm wheel, and due to the absence of intermediate mechanical couplings. A disadvantage of the worm drive is that it uses a frictional coupling, but frictional loads and wear would not be too significant if the tracking system is balanced so as to prevent weight loading in the drive train.

The declination drive element 15 (FIG. 4) could be directly controlled by a declination drive actuator (e.g. a stepping motor) attached to the module's truss structure, but the declination tracking motion would preferably be transmitted from a single actuator attached to the base structure to all of an array's tracking modules via a master declination drive element. Mechanical coupling between the master element and each module's individual declination drive element can be effected most efficiently by transmitting the motion through a coupling wheel which turns on the module's polar axis. The advantage of this arrangement is that the master drive element can comprise a linear component such as a shaft, flat belt or cable which transmits the tracking motion via a simple axial rotation or axial translation movement—no lateral movement of the element is required.

Figure 11:
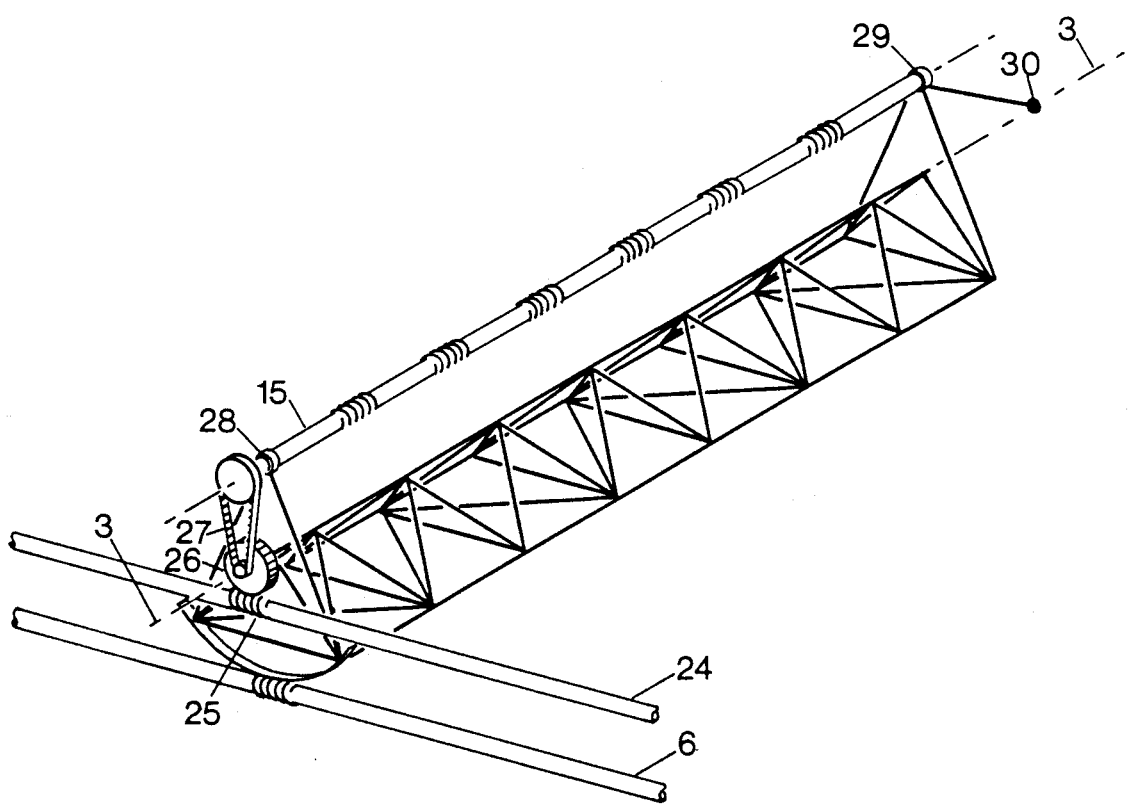
FIG. 11 illustrates a declination drive train configuration which includes a master declination drive element.

FIG. 11 illustrates a declination drive train in which the master drive element 24 is a rotational shaft parallel to the polar drive element 6. The shaft transmits the tracking motion via a worm 25 to a coupling wheel 26 comprising a small gear which turns on the polar axis 3, and the gear transmits the motion via a timing belt 27 to the module's declination drive 15, which comprises a rotational worm drive. (Although the coupling wheel's rotational position in relation to the module's truss structure depends only on the declination tracking position, its position in relation the the base structure depends also on the truss's polar tracking position; hence the master declination drive element's position will be a function of the polar as well as declination tracking angles.) The module's drive shaft 15 is supported by two axle bearings 28 and 29 which are attached to the module's truss by four struts. A fifth strut links bearing 29 to an axial bearing 30 which is attached to the base structure and turns on the polar axis 3.

[If each module's declination drive element 15 is a rotational shaft (e.g. a worm drive) which turns on the polar axis 3, the master declination drive element can be coupled directly to the module's declination drive element without the intervening coupling wheel 26.]

Figure 12:
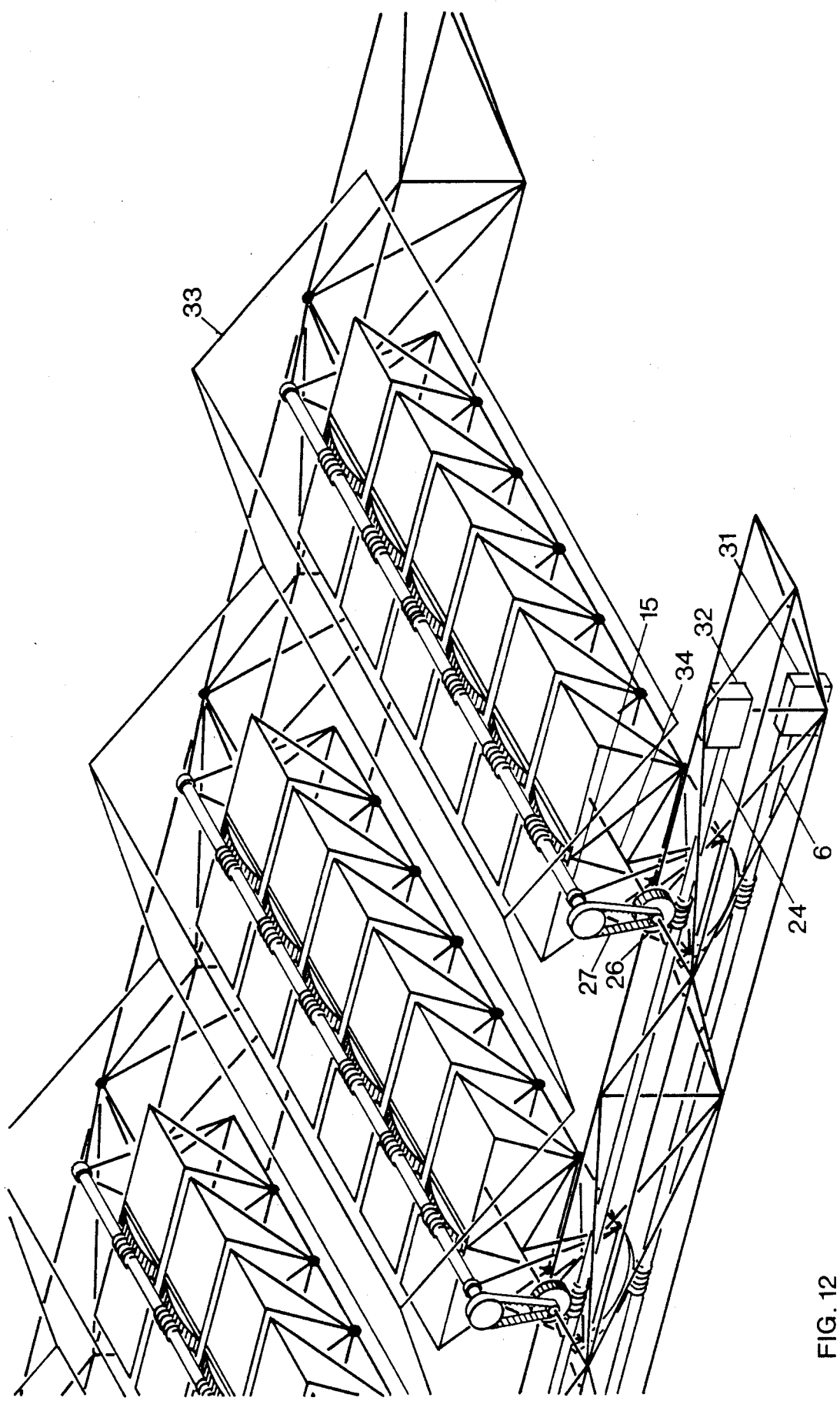
FIG. 12 illustrates an assembled tracking collector system.

FIG. 12 illustrates a portion of an assembled tracking array exhibiting several of the design features described above. (The polar drive element 6, the master declination drive element 24, and the modules' declination drive elements 15 are all worm drives. The boxes 31 and 32 are drive actuators.) A roof-shaped glass cover 33 shelters each tracking module. In the illustrated embodiment, the polar tracking axis is centered on one of the modules's longitudinal truss elements (element 34 in FIG. 12), but it might alternatively be positioned above the truss in order to minimize the amount of glass required for the enclosure. The required glass area is related to the collector apertures' positional range of motion, which can be minimized by locating the polar axis as close as possible to the apertures. Also, if the module's declination drive element 15 is a rotational shaft (e.g. a worm drive) and the polar axis coincides with the shaft's axis, the master declination drive 24 may be coupled directly to element 15, eliminating the need for the intervening coupling gear 26 and timing belt 27. However, these advantages must be weighed against another design consideration, the effect of weight imbalances on the polar drive's load and on strain-induced tracking errors, which would tend to favor a polar axis located closer to the module's center of gravity.

Problems associated with weight imbalances can be avoided by using a system of counterweights or tensioning springs to counterbalance the weight load. An array's declination drive would not be too significantly affected by weight loading since it only operates on an annual tracking cycle, but significant problems could arise with the polar drive which must move the entire weight of several tracking modules on a diurnal tracking cycle. The counterbalance system could eliminate weight loading and weight-induced frictional loading in the polar drive train, resulting in reduced power requirements for the drive motor, reduced frictional wear in the drive couplings, and improved tracking tolerance due to reduced strain in the drive train.

A counterbalance system could also improve tracking accuracy by reducing strain in the tracking structure, particularly in the modules' truss structures. The system configuration outlined above might exhibit significant torsional strain in the trusses since the polar drive provides torsional support at only one end of each truss. This strain can be greatly reduced by applying the counterbalance force symmetrically at both ends of the truss.

Figure 13:
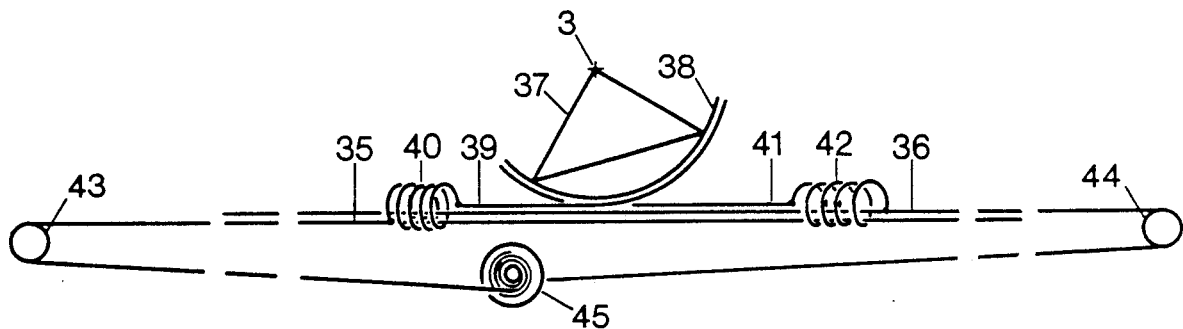
FIG. 13 illustrates a simple spring tensioning system which counterbalances a gravitational potential proportional to $\cos \gamma$ ($\gamma$ is the polar tracking angle).

FIG. 13 schematically illustrates a simple counterbalance system which could significantly reduce weight loading in the polar drive train, eliminating the load entirely for a particular declination tracking position. The counterbalance force is transmitted through two oppositely-pulling main cables 35 and 36 to all of the tracking modules in an array. Each module's truss structure (e.g. truss 37, viewed end-on) has an attached pulley segment 38 centered on the module's polar axis 3. (Element 38 may also comprise the polar drive wheel 5 in FIG. 2.) A short connector cable 39 attached to and guided over the pulley segment is linked through a tensioning spring 40 to cable 35, and the pulley segment is similarly coupled to cable 36 via another connector cable 41 and tensioning spring 42. (Cable 35 ends at its right-most spring attachment, and cable 36 ends at the left-most spring.) The main cables 35 and 36 are guided over pulleys 43 and 44 and are wound on a rotational element 45 (shown on-axis in FIG. 13) which functions as a spring tension regulator.

Figure 14:
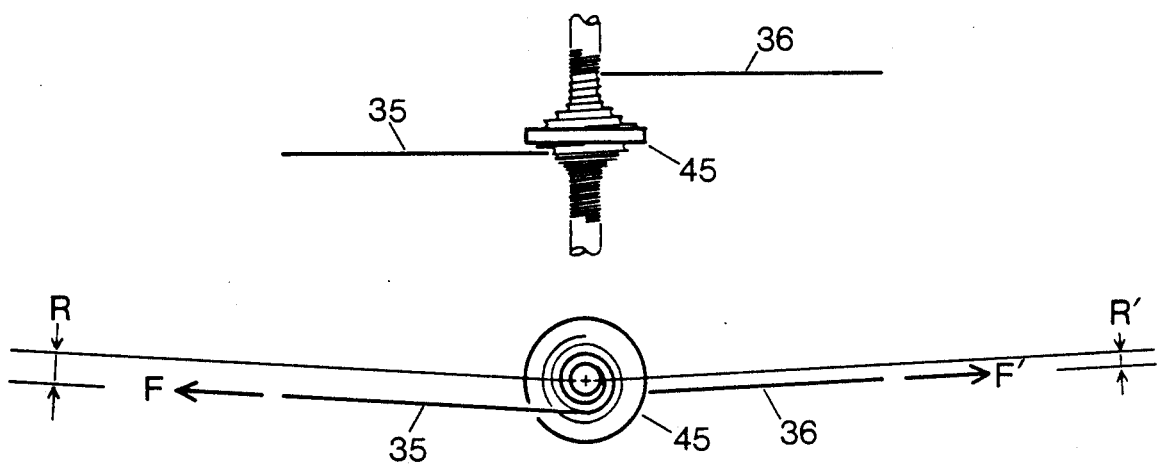
FIG. 14 illustrates a top view and an axial view of a tensioning system's spring tension regulator.

FIG. 14 illustrates an axial view (lower view) and top view (upper view) of the tension regulator 45. The cables 35 and 36 are wound in grooves having a helical spiral form which is designed to induce an optimum tension differential between the two cables. The spring forces will cause the tension regulator to seek an equilibrium position at which the cables exert equal and opposite torques on the regulator. The equilibrium torque $\tau$ will be equal to the product of cable 35's tension force F and its winding radius R:

$$\tau = F \cdot R,$$

and will also be equal to the product of cable 36's tension force F' and its winding radius R':

$$\tau = F' \cdot R'.$$

(Each cable's "winding radius" is defined as the distance from the regulator's axis to a line extending from the cable's straight section—see FIG. 14.) If the winding radii R and R' differ, the tension regulator will induce a force differential between the main cables 35 and 36, $$F - F' = \tau(1/R - 1/R'),$$

which will translate to a force differential between the connector cables 39 and 41 (FIG. 13) tending to offset weight-induced torque on the polar axis.

The cables' winding radii R and R' are determined by the regulator's rotational position and by the geometry of its helical spiral grooves, which can be designed so that the tensioning springs' elastic potential energy plus the tracking modules' gravitational potential is independent of the polar tracking position for a particular fixed declination tracking position. The array's gravitational potential GP has the following type of functional dependence on the polar tracking position:

$$GP = A + B \cos \gamma$$

where $\gamma$ is the polar tracking angle (measured from the meridian) and A and B are constants (for a fixed declination tracking position). Given a specification of the tensioning springs' force versus length characteristics, a mathematical specification of the tension regulator's groove geometry can be determined so that the springs' elastic potential EP has the form $$EP = A' - B \cos \gamma$$

where A' is a constant; hence the system's total potential energy, GP+EP will be constant:

$$GP + EP = A + A' = \text{constant},$$

and no force will be required to hold the modules' polar tracking position.

The counterbalance system described above entirely eliminates weight loading in the polar drive train for a particular declination tracking position. A similar but somewhat more complicated system can also be designed to eliminate the load for all declination tracking positions. Taking declination tracking into account, the tracking array's gravitational potential GP has the functional form $$GP = A + B \cos \gamma + C \cos \gamma \cos \delta + D \sin \delta$$

where $\gamma$ is the polar tracking angle, $\delta$ is the declination tracking angle (measured from the equinox position), and A, B, C and D are constants. Using a trigonometric relation, the above expression can be equivalently stated, $$GP = A + B \cos\gamma + \frac{C}{2}\cos(\gamma + \delta) + \frac{C}{2}\cos(\gamma - \delta) + D \sin\delta.$$

A counterbalance system designed to balance a gravitational potential of this form could comprise several spring tensioning systems, each functioning to balance one of the four potential terms in the above expression. The cos $\gamma$ potential term may be balanced by a system such as that described above. The sin $\delta$ term could be balanced by similar means, however this term does not give rise to forces on the polar drive train (since it does not depend on the polar angle $\gamma$) so it need not be counterbalanced.

A potential term porportional to cos $(\gamma \pm \delta)$ can be balanced by the following general means: The motions of two mechanical components coupled to the tracking drives (e.g., cables, shafts or gears) are combined in a differential element such as a differential gear or a pulley configuration. The position of one component is a function only of $\gamma$ and the other's position is a function only of $\delta$, and the differential combines their motions in such a way that the position of a third component driven by the differential is a function only of $\gamma \pm \delta$. A spring tensioning system coupled to this third component can be designed so that its elastic potential is proportional to cos $(\gamma \pm \delta)$.

Figure 15:
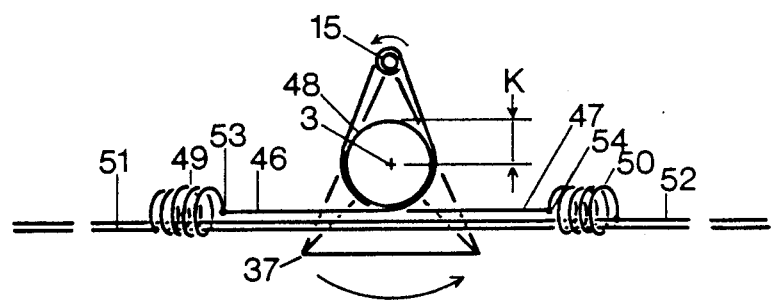
FIG. 15 illustrates a spring tensioning system which counterbalances a gravitational potential proportional to $\cos (\gamma + \delta)$ ($\gamma$ and $\delta$ are the polar and declination tracking angles).

The design approach outlined above is illustrated by the system shown schematically in FIG. 15. In this illustration the module's declination drive element 15 is a rotational worm drive (shown on-axis in FIG. 15). Two cables 46 and 47 are attached to one end of the drive shaft 15 and are wound around the shaft in opposite directions. The cables are guided over a pulley 48 which turns freely on the polar axis 3 (the pulley is not attached to the truss 37) and tensioning springs 49 and 50 link the cables 46 and 47 to main cables 51 and 52 which are helically wound on a tension regulator of the type described previously. (The main cables 51 and 52 are similarly coupled to other tracking modules.)

We will take the polar tracking angle $\gamma$ to be positive in the direction associated with a counterclockwise rotation of the truss 37 and we also take the declination tracking angle $\delta$ to be positive in the direction associated with a counterclockwise rotation of the worm drive 15, as illustrated by the direction arrows in FIG. 15. (Angles are in radians.) As the polar drive rotates the module through a positive incremental angle d$\gamma$ (with the declination angle $\delta$ held fixed), the linkage points 53 and 54 between the cables 46 and 47 and springs 49 and 50 will both translate to the right by a distance dL=K d$\gamma$, where K is the pulley radius. With $\gamma$ held fixed, a positive change d$\delta$ in the declination angle will cause the coupling points to move to the right by a distance dL that is proportional to d$\delta$, and by choosing an appropriate winding radius on the drive shaft 15 the proportionality constant can be made equal to K: dL=K d$\delta$. For general tracking angles $\gamma$ and $\delta$, the displacement L of points 53 and 54 from their reference locations at $\gamma=0$, $\delta=0$ will be $$L = K(\gamma + \delta).$$

Hence, the tension regulator can be designed to induce a spring potential term proportional to cos $(\gamma + \delta)$. If the winding directions of cables 46 and 47 on the shaft 15 are reversed, the cable displacement L will be $L = K(\gamma - \delta)$ and a spring potential term proportional to $\cos(\gamma - \delta)$ will be generated.

Weight loading in the polar drive train can be eliminated by coupling the tracking modules to three spring tensioning systems which balance the three potential terms, $\cos \gamma$, $\cos(\gamma + \delta)$ and $\cos(\gamma - \delta)$. A fourth system could also be incorporated to balance the $\sin \delta$ potential term as well, in order to reduce weight loading in the declination drive train. This system might somewhat resemble the FIG. 15 configuration. (If the pulley radius K in FIG. 15 is made vanishingly small, the cable displacement L will essentially depend only on $\delta$, so the tension regulator can be designed to maintain a spring potential proportional to $\sin \delta$. Only one of the cables 51 or 52 and associated spring couplings would be required for this system since the tensioning force associated with the $\sin \delta$ term would always be in the same direction—the direction tending to pull the concentrator units northward if the system is located in northern latitudes, or southward in southern latitudes). A system of this type would eliminate weight loading between the declination drive actuator and the modules' declination drive shafts, although it would not affect weight loads between the drive shafts and the concentrator units. Weight loading and weight-induced frictional loads could be eliminated throughout the declination drive train by coupling the concentrator units directly to spring tensioning systems, but this would significantly complicate the collector design and may provide only marginal benefits since the declination drive only operates on an annual tracking cycle.

A counterbalanced collector array of the type illustrated above may exhibit considerable torsional strain in the modules' truss structures since each truss's torsional support is applied only at one end of the truss. However, the torsional strain can be greatly reduced by using two similar counterbalance systems at opposite ends of the trusses so that the balancing force on each truss is applied symmetrically at both ends.

I claim:

1. A tracking solar collector mechanism comprising:
   (1.1) a stationary base structure which supports the tracking components;
   (1.2) two parallel rows of uniformly spaced axial polar bearings attached to the base structure, each row comprising at least one bearing, wherein each member bearing of each row is coaligned with an associated bearing of the other row, the line joining each pair of coaligned polar bearings defining an associated polar tracking axis wherein the pairs' polar axes are mutually parallel and are adapted to be aligned with the Earth's axis;
   (1.3) at least one tracking module, each of which is supported by and turns on one of the pairs of coaligned polar bearings and which comprises
      (1.3.1) a truss structure comprising a rigid space-frame assembly attached to and spanning the space between the module's two polar bearings,
      (1.3.2) a large-radius polar wheel segment which is centered on the module's polar axis and rigidly attached to its truss structure, wherein the truss's position is constrained by its two supporting polar bearings and by a polar drive coupling on the circumference of the polar wheel segment,
      (1.3.3) two rows of evenly spaced axial declination bearings attached to the module's truss structure, wherein both rows are parallel to the polar axis and are disposed alongside the truss with the truss between them, and each member bearing of each row is coaligned with an associated bearing of the other row, the line joining each pair of co-aligned declination bearings defining an associated declination tracking axis wherein the pairs' declination axes are mutually parallel and are preferably aligned perpendicular to the module's polar axis,
      (1.3.4) a set of declination-tracking concentrator units, each of which is supported by and turns on one of the pairs of co-aligned declination bearings and which comprises
         (1.3.4.1) a space-frame structure comprising four structural elements rigidly linking each of the unit's two declination bearings to each of two mounting points, and a fifth structural element rigidly linking the two mounting points, wherein the two mounting points and the two declination bearings define the corners of a tetrahedron straddling the module's truss structure,
         (1.3.4.2) a large-radius declination wheel segment which is centered on the unit's declination axis and which extends across and is rigidly attached to the unit's two mounting points, wherein the unit's position in relation to the supporting truss structure is constrained by its two declination bearings and by a declination drive coupling on the circumference of the declination wheel segment, and
         (1.3.4.3) two lens-receiver assemblies, each comprising a focusing Fresnel lens and a small solar energy receiver, wherein each assembly is mounted on one of the two triangular structural frameworks defined by one of that declination-tracking unit's two declination bearings, its two mounting points, and the structural elements linking these three elements, and
      (1.3.5) a declination drive element which extends across all of the module's declination wheel segments and which simultaneously transmits the declination tracking motion through the declination drive couplings to all of the module's concentrator units;
   (1.4) polar drive means whereby each module's polar tracking position is controlled by a polar tracking actuator, wherein the actuator's motion is transmitted to at least one module through the polar drive coupling on the module's polar wheel segment; and
   (1.5) declination drive means whereby the declination tracking positions of each tracking module's concentrator units are all controlled by a single declination tracking actuator, wherein the actuator's motion is transmitted through the module's declination drive element.

2. A tracking solar collector mechanism of claim 1 wherein each polar tracking actuator (1.4) is coupled to only one tracking module and the polar drive means (1.4) comprises a simple mechanical coupling between the actuator and the module's polar wheel segment.

3. A tracking solar collector mechanism of claim 2 wherein the polar drive means comprises a gear mesh, timing belt or cable winding.

4. A tracking solar collector mechanism of claim 1 wherein each declination tracking actuator (1.5) is attached to a tracking module's truss structure and is coupled to only that module's declination drive element, and wherein the declination drive means (1.5)

comprises a simple mechanical coupling between the actuator and the module's declination drive element.

5. A tracking solar collector mechanism of claim 4 wherein the declination drive means comprises a gear mesh, timing belt or cable winding.

6. A collector array comprising a tracking solar collector mechanism of claim 1 wherein the base structure supports more than one tracking module.

7. A collector array of claim 6 wherein the array's tracking modules are all controlled by a single polar tracking actuator (1.4) and the polar drive means (1.4) comprises a polar drive element which extends across all of the modules' polar wheel segments and which simultaneously transmits the polar tracking motion through the polar drive couplings (1.3.2) to all of the polar wheel segments.

8. A collector array of claim 7 wherein the polar drive element comprises a shaft, flat belt or cable.

9. A collector array of claim 6 wherein the array's tracking modules are all controlled by a single declination tracking actuator (1.5) attached to the array's base structure and the declination drive means (1.5) comprises:

(6.1) a set of coupling wheels, one for each module, wherein each coupling wheel turns on a module's polar axis and is coupled by simple mechanical means to the module's declination drive element, and (6.2) a master declination drive element which extends across and is coupled by simple mechanical means to each coupling wheel and which simultaneously transmits the declination tracking motion through the coupling wheels to all of the modules' individual declination drive elements.

10. A collector array of claim 9 wherein the coupling wheels (6.1) comprise gears or pulleys and associated coupling means comprise a gear mesh, timing belt or cable windings, and the master declination drive element (6.2) comprises a shaft, flat belt or cable, and associated coupling means comprises a gear mesh, timing belt or cable winding.

11. A collector array of claim 6 wherein each module's declination drive element (1.3.5) is a rotational shaft which turns on the module's polar axis, and wherein the array's tracking modules are all controlled by a single declination tracking actuator (1.5) attached to the array's base structure and the declination drive means (1.5) comprises a master declination drive element which extends across and is coupled by simple mechanical means to each module's declination drive element (1.3.5) and which simultaneously transmits the tracking motion to all of the modules.

12. A collector array of claim 11 wherein the module's declination drive element comprises a worm drive, the master declination drive element comprises a shaft, flat belt or cable, and its associated coupling means comprises a gear mesh, timing belt or cable winding.

13. A tracking solar collector mechanism of claim 1 wherein the polar wheel segment (1.3.2) comprises a gear segment or a pulley segment, the declination wheel segment (1.3.4.2) comprises a gear segment or a pulley segment, and the declination drive element (1.3.5) comprises a shaft, flat belt or cable.

* * * * *